(12) United States Patent
Lane

(10) Patent No.: US 7,670,964 B2
(45) Date of Patent: Mar. 2, 2010

(54) APPARATUS AND METHODS OF FORMING A GAS CLUSTER ION BEAM USING A LOW-PRESSURE SOURCE

(75) Inventor: Scott Lane, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 11/689,572

(22) Filed: Mar. 22, 2007

(65) Prior Publication Data

US 2008/0230714 A1 Sep. 25, 2008

(51) Int. Cl.
*H01L 21/31* (2006.01)

(52) U.S. Cl. ...................................... 438/788

(58) Field of Classification Search ........................ None
See application file for complete search history.

(56) References Cited

U.S. PATENT DOCUMENTS

| | | | |
|---|---|---|---|
| 4,281,029 A | 7/1981 | Takagi et al. | |
| 4,286,545 A | 9/1981 | Takagi et al. | |
| 5,031,408 A | 7/1991 | Horne et al. | |
| 5,370,739 A * | 12/1994 | Foster et al. | 118/725 |
| 6,394,760 B1 | 5/2002 | Tell | |
| 6,486,478 B1 * | 11/2002 | Libby et al. | 250/492.1 |
| 6,797,334 B2 | 9/2004 | Akizuki et al. | |
| 7,063,097 B2 | 6/2006 | Arno et al. | |
| 2001/0010835 A1 | 8/2001 | Akizuki et al. | |
| 2002/0068128 A1 | 6/2002 | Akizuki et al. | |
| 2004/0037970 A1 | 2/2004 | Akizuki et al. | |
| 2004/0113093 A1 | 6/2004 | Mack | |
| 2004/0137733 A1 | 7/2004 | Hautala | |
| 2005/0077172 A1 * | 4/2005 | Wachi et al. | 204/228.5 |
| 2006/0093753 A1 | 5/2006 | Nickel | |
| 2006/0097185 A1 | 5/2006 | Mack | |
| 2006/0172086 A1 | 8/2006 | Nickel | |
| 2007/0164206 A1 * | 7/2007 | Ishiuchi | 250/282 |

FOREIGN PATENT DOCUMENTS

JP 06275548 A 9/1994

(Continued)

OTHER PUBLICATIONS

A new simple static method for the determination of solubilities of condensed compounds in supercritical fluid A. Galia, A. Argentino, O. Scialdone, G. Filardo Dipartimento di Ingegneria Chimica dei Processi e dei Materiali, Uni_ersity of Palermo, Viale delle Scienze, 90128 Palermo, Italy Received Sep. 15, 2001; received in revised form 20 D.*

(Continued)

*Primary Examiner*—Charles D Garber
*Assistant Examiner*—Andre' C Stevenson
(74) *Attorney, Agent, or Firm*—Wood, Herron & Evans, LLP

(57) ABSTRACT

Embodiments of a gas cluster ion beam apparatus and methods for forming a gas cluster ion beam using a low-pressure process source are generally described herein. In one embodiment, the low-pressure process source is mixed with a high-pressure diluent source in a static pump to form a mixed source, from which a gas cluster jet is generated and ionized to form the gas cluster ion beam. Other embodiments may be described and claimed.

22 Claims, 4 Drawing Sheets

FOREIGN PATENT DOCUMENTS

| | | |
|---|---|---|
| JP | 2002252219 A | 9/2002 |
| WO | 0106538 A1 | 1/2001 |
| WO | 2004107425 | 12/2004 |
| WO | 2005060602 | 7/2005 |
| WO | 2007002130 A2 | 1/2007 |

OTHER PUBLICATIONS

European Patent Office, International Search Report and Written Opinion for corresponding International Application No. PCT/US2008/057627 dated Nov. 10, 2008, 11 pp.

* cited by examiner

APPARATUS AND METHODS OF FORMING A GAS CLUSTER ION BEAM USING A LOW-PRESSURE SOURCE

FIELD OF THE INVENTION

The field of invention relates generally to the field of semiconductor integrated circuit manufacturing and, more specifically but not exclusively, relates to an apparatus and methods of forming a gas cluster ion beam with a plurality of gas sources.

BACKGROUND INFORMATION

The use of a gas cluster ion beam (GCIB) for etching, cleaning, and smoothing surfaces is known in the art. GCIBs have also been employed for assisting the deposition of films from vaporized carbonaceous materials. For purposes of this discussion, gas clusters are nano-sized aggregates of materials that are gaseous under conditions of standard temperature and pressure. Such clusters may consist of aggregates of from a few to several thousand molecules or more that are loosely bound to form a cluster. The clusters can be ionized by electron bombardment, permitting them to be formed into directed beams of controllable energy. Such ions each typically carry positive charges of qe (where e is the magnitude of the electronic charge and q is an integer of from one to several representing the charge state of the cluster ion). The larger sized cluster ions are often the most useful because of their ability to carry substantial energy per cluster ion, while yet having only modest energy per molecule. The clusters disintegrate on impact, with each individual molecule carrying only a small fraction of the total cluster energy. Consequently, the impact effects of large clusters are substantial, but are limited to a very shallow surface region. This makes gas cluster ions effective for a variety of surface modification processes, without the tendency to produce deeper subsurface damage, which is characteristic of conventional ion beam processing.

Presently available cluster ion sources produce cluster ions having a wide distribution of sizes, N, up to N of several thousand (where N=the number of molecules in each cluster). Clusters of atoms can be formed by the condensation of individual gas atoms (or molecules) during the adiabatic expansion of high-pressure gas from a nozzle into a vacuum. A skimmer with a small aperture strips divergent streams from the core of this expanding gas flow to produce a collimated beam of clusters. Neutral clusters of various sizes are produced and held together by weak interatomic forces known as Van der Waals forces. This method has been used to produce beams of clusters from a variety of gases such as argon, oxygen, nitrogen, nitrogen trifluoride, sulfur hexafluoride, diborane, boron trifluoride, and germane.

Several emerging applications for GCIB processing of workpieces on an industrial scale are in the semiconductor field. Although GCIB processing of workpieces is done using a wide variety of gas cluster source gases, many of which are inert gases, in many semiconductor processing applications it is desirable to use reactive source gases in the formation of GCIBs, sometimes in combination or mixture with inert or noble gases. When using a combination of source gases, all source gases to be delivered from the source canister, cylinder, or system are mixed at a single high pressure for entry into the nozzle. Compressing a low-pressure source to a pressure equal to a high-pressure source, such as with a piston, rotary vane, roots blower, or scroll type mechanical pump, may lead to source problems such as fouling or plugging due to nucleation and condensation of the low-pressure source during mechanical compression or after compression but before entry to the nozzle.

BRIEF DESCRIPTION OF THE DRAWINGS

The present invention is illustrated by way of example and not as a limitation in the figures of the accompanying drawings, in which.

DETAILED DESCRIPTION

Figure 1:
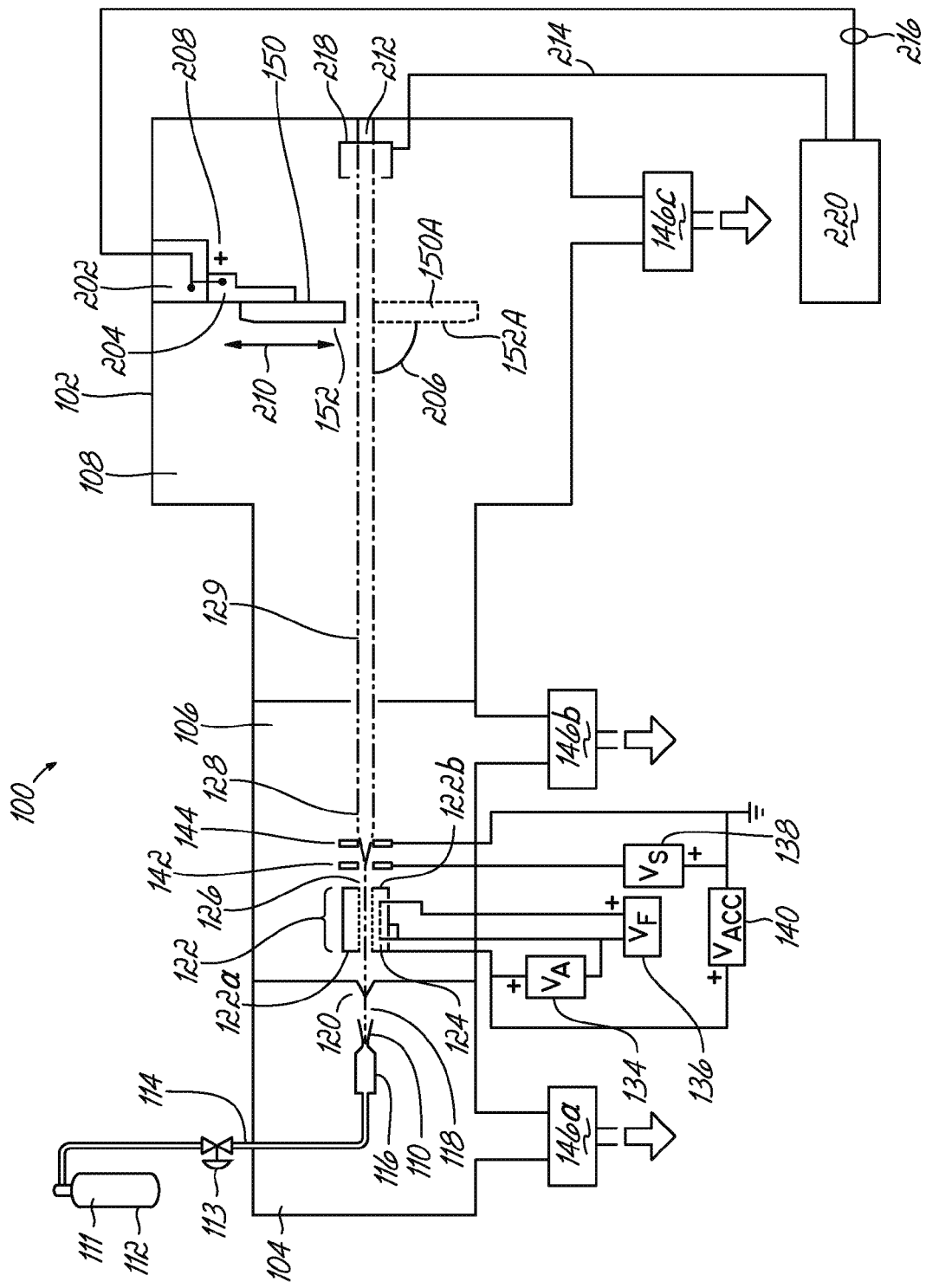
FIG. 1 is an illustration showing the basic elements of a prior art GCIB processing apparatus.

An apparatus and method for forming a gas cluster ion beam using a plurality of gas sources, including at least one low-pressure source, is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for forming a gas cluster ion beam using a plurality of gas sources, including a low-pressure process source. By forming a gas cluster ion beam using a low-pressure process source, a higher pressure source may be used to generate a desired pressure drop across a nozzle while incorporating the low-pressure process source using a static pump. One embodiment of a method of forming a gas cluster ion beam with a plurality of gas sources may comprise providing a reduced-pressure enclosure. A low-pressure process source and a high-pressure diluent source are mixed using a static pump to form a mixed source. A gas cluster jet is generated using the mixed source, comprising a plurality of gas clusters within the reduced-pressure enclosure. An ionization region within the reduced-pressure enclosure is also provided. The gas cluster jet is directed through the ionization region to ionize at least a portion of the gas clusters in the gas cluster jet to form a gas cluster ion beam.

FIG. 1 shows a configuration for a GCIB processing apparatus 100 of a form known in prior art, and which may be described as follows: a vacuum vessel 102 is divided into three communicating chambers, a source chamber 104, an ionization/acceleration chamber 106, and a processing chamber 108 to provide a reduced-pressure enclosure. The three chambers are evacuated to suitable operating pressures by vacuum pumping systems 146a, 146b, and 146c, respectively. In one embodiment, the operating pressure of the source chamber 104 is substantially between 0.001 and 0.00001 Torr.

A condensable source gas 112 (for example argon or oxygen) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, suppressor electrode 142, and processing chamber 108). Suitable condensable source gases 112 include, but are not limited to argon, nitrogen, carbon dioxide, oxygen, nitrogen trifluoride, and other gases and/or gas mixtures.

After the supersonic gas jet 118 containing gas clusters has been formed, the clusters are ionized using an ionizer 122. Ionizer 122 includes an inlet end 122a and an outlet end 122b that partially define an ionization region through which the gas jet 118 containing gas clusters is directed along an axis thereof. The ionizer 122 is typically an electron impact ionizer that produces thermoelectrons from one or more incandescent filaments 124 and accelerates and directs the electrons, causing them to collide with the gas clusters in the gas jet 118 where the jet passes through the ionizer 122. The impact of electrons with the gas clusters causes electrons to eject from the clusters, thereby causing a portion of the clusters to become positively ionized. Some clusters may have more than one electron ejected and may become multiply ionized. Suppressor electrode 142 and grounded electrode 144 extract the cluster ions from the ionizer exit aperture 126 at outlet end 122b, accelerate them to a desired energy (typically with acceleration potentials of from several hundred V to several tens of kV, and focus them to form a GCIB 128. The axis 129 of the supersonic gas jet 118 containing gas clusters is substantially the same as the axis of the GCIB 128. Filament power supply 136 provides filament voltage $V_F$ to heat the filament 124. Anode power supply 134 provides anode voltage $V_A$ to accelerate thermoelectrons emitted from filament 124 to cause the thermoelectrons to irradiate the cluster containing gas jet 118 to produce cluster ions. Suppression power supply 138 provides suppression voltage $V_S$ to bias suppressor electrode 142. Accelerator power supply 140 provides acceleration voltage $V_{Acc}$ to bias the ionizer 122 with respect to suppressor electrode 142 and grounded electrode 144 so as to result in a total GCIB acceleration potential equal to $V_{Acc}$. Suppressor electrode 142 serves to extract ions from the ionizer exit aperture 126 of ionizer 122, to prevent undesired electrons from entering the ionizer 122 from downstream, and to form a focused GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan a large-area workpiece 152 through the stationary GCIB 128 to produce spatially homogeneous workpiece processing results.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150, in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to a workpiece 152 surface. The angle of beam incidence 206 may be 90 degrees or some other angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128, and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer-based controller, connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2:
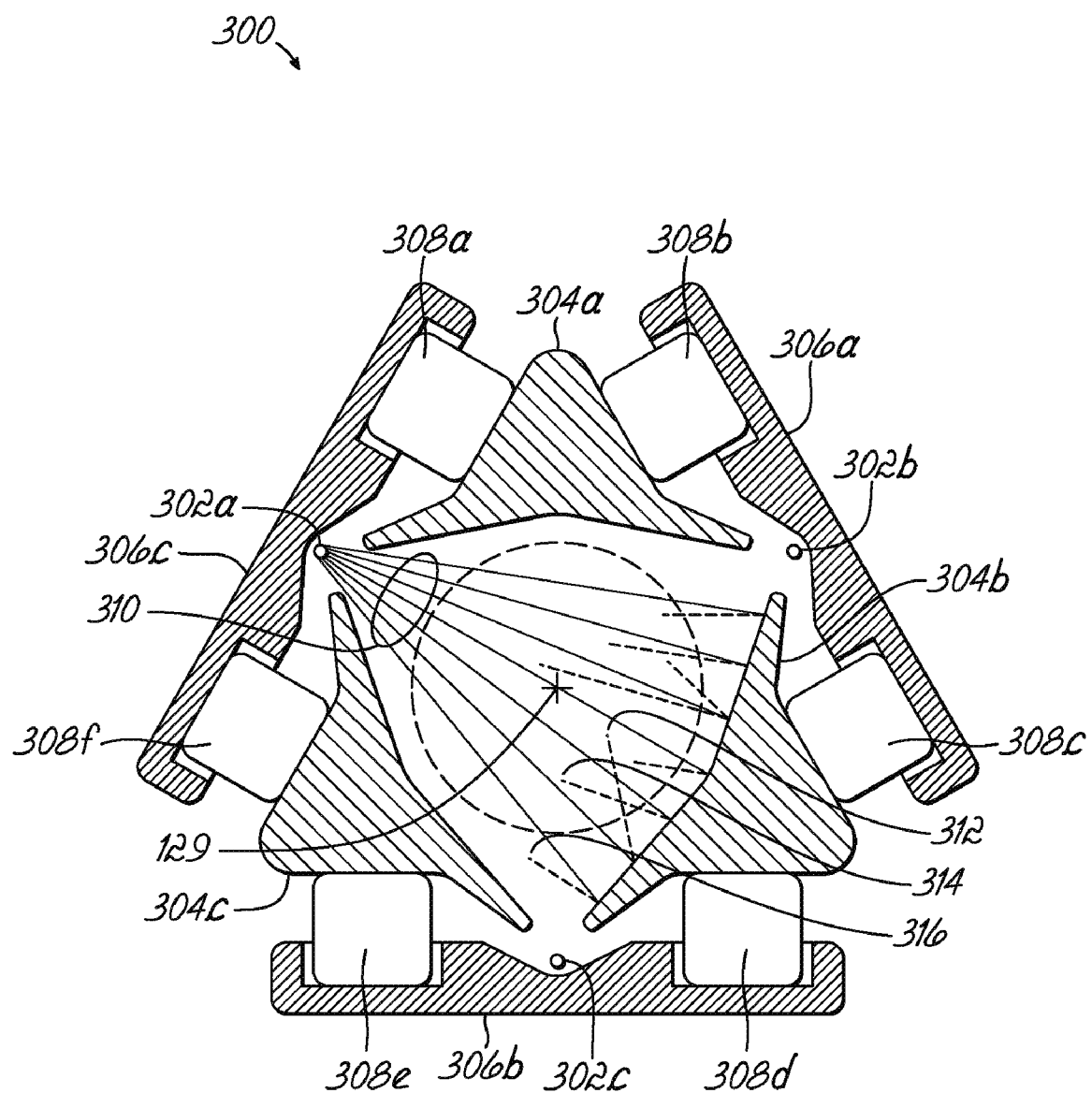
FIG. 2 is an illustration of a portion of a prior art gas cluster ionizer for ionizing a gas cluster jet.

FIG. 2 shows a section 300 of a prior art gas cluster ionizer for ionizing a gas cluster jet. The section 300 is transverse to the jet axis 129. Clusters leaving the skimmer aperture (120, FIG. 1) and entering an ionizer (122, FIG. 1) will travel with roughly the sound velocity characteristic of the gas. For typical gas cluster sizes (2000 to 15000 atoms), this corresponds to a kinetic energy of 130 to 1000 electron volts (eV). At these low energies, any departure from space charge neutrality within the ionizer 122 will result in a rapid blow up of the jet with a significant loss of beam current. FIG. 2 illustrates a prior art self-neutralizing ionizer. As with other prior art ionizers, gas clusters are ionized by electron impact. In this design, thermoelectrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermoelectrons 310 pass through the gas cluster jet and the jet axis 129 and then strike the opposite beam-forming electrode 304b to produce low energy secondary electrons (312, 314, and 316 indicated for examples).

Though (for simplicity) not shown, linear thermionic filaments 302b and 302c also produce thermoelectrons that subsequently produce low energy secondary electrons. All the secondary electrons help ensure that the ionized cluster jet remains space charge neutral by providing low energy electrons that can be attracted into the positively ionized gas cluster jet as required to maintain space-charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. This self-neutralizing ionizer is very effective and achieves over 1000 micro Amps argon GCIBs. A major limitation of the self-neutralizing ionizer of FIG. 2 is that gases evolved from gas clusters during the ionization processes produce an elevated internal pressure. With corrosive gases, particularly nitrogen trifluoride in oxygen, this results in attack of the various ionizer parts, particularly the linear thermionic filaments 302a, 302b, and 302c. Accordingly, filament life is shortened and unacceptable metal contamination is produced on workpieces being processed by GCIB.

Figure 3:
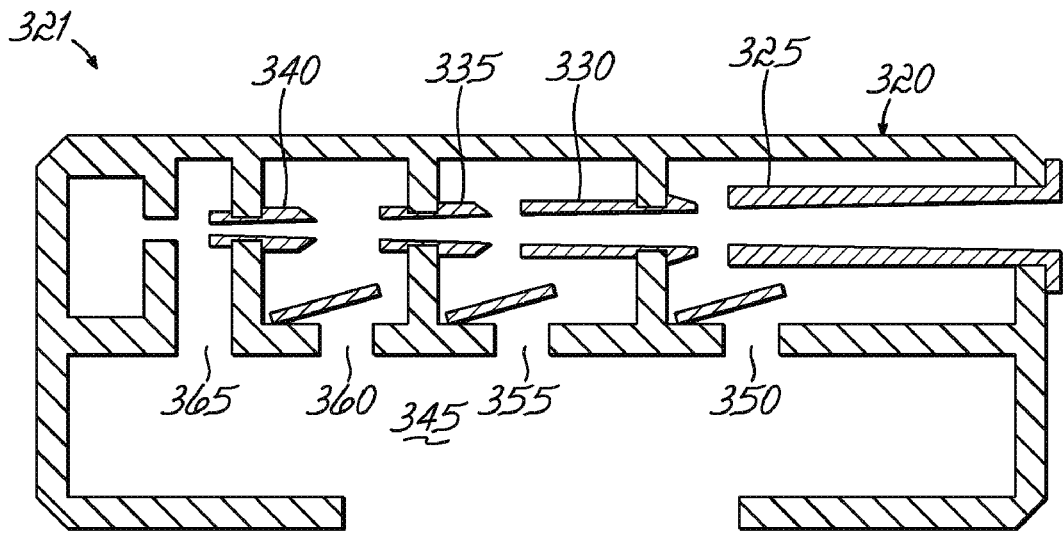
FIG. 3 is an illustration of a prior art multi-stage vacuum pump or ejector.
Figure 4:
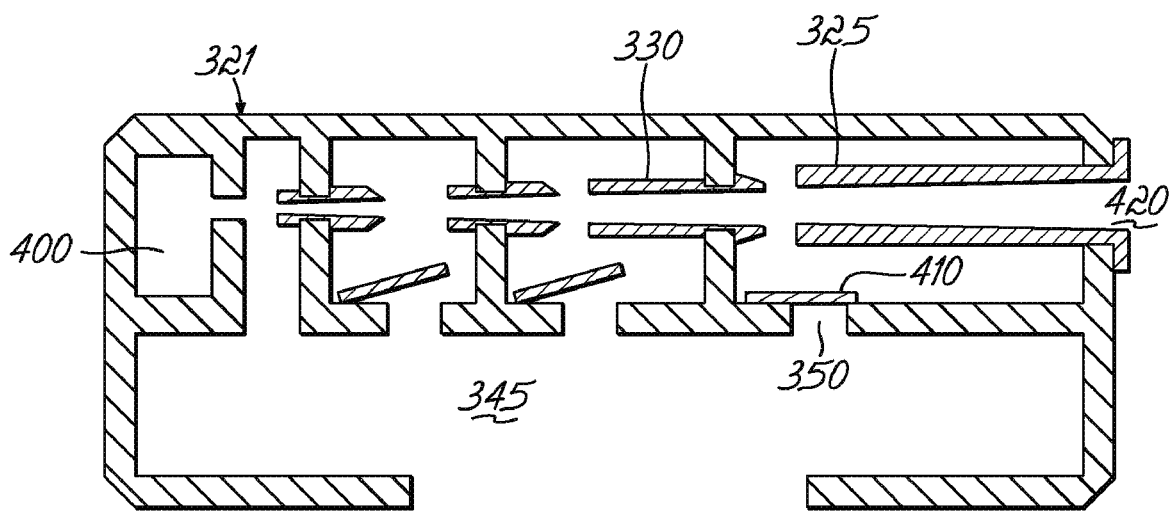
FIG. 4 is another illustration of a prior art multi-stage vacuum pump or ejector.

FIG. 3 is an illustration of a prior art ejector comprising a housing 320, wherein ejector nozzles 325, 330, 335 and 340 are supported in series with intermediate gaps separately communicating with a chamber 345 via ports 350, 355, 360 and 365, respectively. In FIG. 3 the ejector 321 is shown in a non-operating mode. In FIG. 4, the ejector 321 is driven by air that is accelerated into a channel 400 and directed through the nozzles from the left hand side to the right hand side of the drawing, whereby a pressure fall is generated in the gaps between the nozzles. In FIG. 4, the total pressure fall over the gaps has reduced the pressure in the chamber 345 to a level that is lower than the pressure fall in the gap between ejector nozzles 325 and 330, causing a flap valve 410 to close the port 350. The multi-stage ejector of FIGS. 3 and 4 is connected via exhaust port 420 to external equipment, driven by the ejector 321.

A source of pressurized gas is connected to a channel 400, which is open on one end and leads to an exhaust port 420 on the other end. The pressurized gas is forced through eductor jets or ejector nozzles 325, 330, 335, and 340 mounted axially on the inside of the pump chamber, pointed in the direction of the exhaust port 420. The passage of the pressurized gas through the channel 400 and into the exhaust port 420 creates suction on an open end of the chamber 345, such that a vacuum is formed at the open end of the chamber 345 and a low-pressure-gas or vapor connected to the open end in will be drawn into the chamber 345 and directed into the exhaust port 420 along with the gas from the ejector nozzles 325, 330, 335, and 340.

Figure 5:
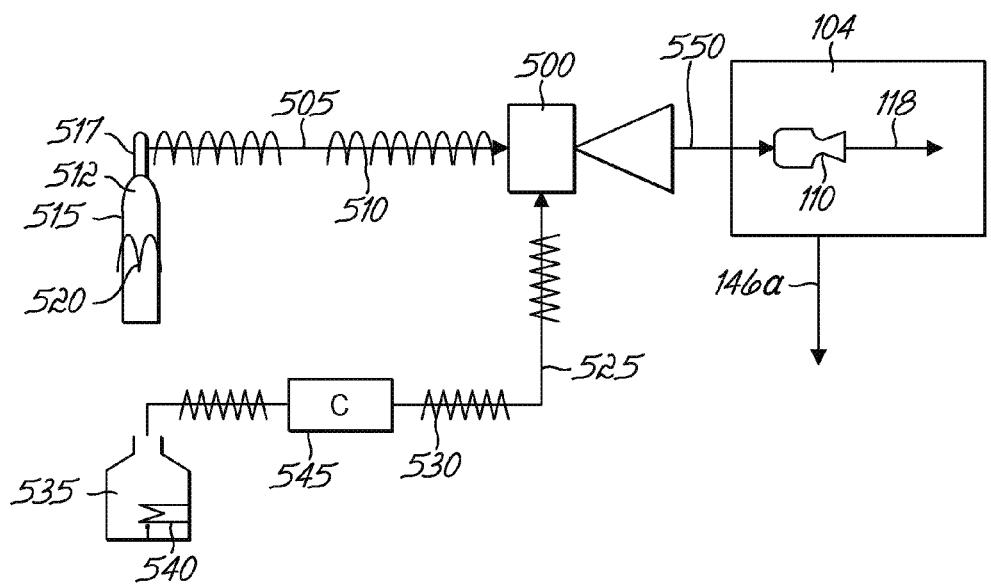
FIG. 5 is an illustration of a delivery system to deliver a mixed source to a GCIB nozzle using a plurality of gas sources at differing pressures.

One embodiment of the invention, as illustrated in FIG. 5, is based on a system for delivery of dilute gases, utilizing a process source, a diluent source, a gas flow metering device for dispensing of the process source, a static pump arranged to mix the process source and the diluent source for forming a diluted process gas mixture to achieve an estimated concentration of process source in the diluted process source mixture to a properly shaped nozzle in a substantially low-pressure vacuum stagnation chamber in a GCIB tool. A supersonic gas jet results. Cooling, which results from the expansion in the jet, causes a portion of the gas jet to condense into clusters, each consisting of from several to several thousand weakly bound atoms or molecules. In another embodiment, the gas flow metering device may be removed and the flow of process source may flow to the static pump without measurement of a delivery system to generate a mixed source for a gas cluster ion beam system. In still another embodiment, a plurality of diluent sources and/or a plurality of low-pressure process sources may be used.

A mixed source is comprised of a high-pressure diluent gas 512 combined with a low-pressure process source 535. The high-pressure diluent gas 512 can be of any suitable type, and can variously include mono-atomic or diatomic single component diluent compositions, as well as multi-component diluent formulations. Illustrative of potentially suitable high-pressure diluent gases 512 in various embodiments of the invention are nitrogen, argon, helium, air, krypton, xenon, xenon halides, hydrogen, oxygen, ammonia, and gaseous organometallic compounds.

A condensable high-pressure diluent gas 512 (for example argon or oxygen) stored in a gas storage cylinder 515 is delivered under pressure through gas regulating valve 517 and gas feed tube 505 to a static pump 500. A cooling system may be used to reduce the temperature and resulting pressure of the diluent gas. For example, the gas storage cylinder 515 may optionally be cooled using a cylinder storage cooling loop 520 (refrigeration unit not shown) to reduce the temperature and total pressure of the high-pressure diluent gas 512. Similarly, the gas feed tube 505 may optionally be cooled using a gas cooling loop 510 (refrigeration unit not shown) to reduce the temperature and total pressure of the high-pressure diluent gas 512 in the gas feed tube 505.

The low-pressure process source 535 can be of any suitable low-pressure gas or vapor type, e.g., a low-pressure gas storage and dispensing vessel or container holding the low-pressure process source 535 to be diluted for use. In one embodiment, the low-pressure process source 535 comprises subatmospheric pressure process storage and dispensing such as a sorptively retained process source, a vapor generating heated ampoule process source, or a regulated pressure gas or vapor process source. The sorptively retained process source 535 may be a process gas retained on a physical adsorbent and selectively desorbed therefrom for dispensing of the process source 535, such as an ATMI SDS® Technology cylinder containing arsine, boron trifluoride, phosphine, germanium tetrafluoride, hydrogen selenide, phosphorous trifluoride, arsenic pentafluoride, or silicon tetrafluoride.

A vapor generating heated ampoule process source 535 may be a vessel containing a solid or liquid that is heated to create a sufficient vapor pressure for use as a process source 535. In one embodiment, the low-pressure process source is an organometallic compound containing a transition metal selected from the group consisting of scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tungsten, rhenium, osmium, iridium, platinum, and gold, and combinations thereof.

The regulated pressure gas or vapor pressure source may be an internally regulated canister with a gas or vapor source that is regulated with a regulation device such as a plurality of internally placed small diameter tubes or a regulator valve placed either within the cylinder, such as a VAC® ATMI cylinder, or outside the cylinder prior to delivery of the process source to the static pump 500. In one embodiment, the regulated pressure gas or vapor pressure source may be boron trifluoride, nitrogen trifluoride, carbon monoxide, germanium tetrafluoride, or silane. Additionally, a compression device such as a mechanical pump (not shown) may be incorporated into a delivery line 525 between the process source 535 and the static pump 500 to compress the low-pressure process source 535 to a pressure just above a condensation pressure at a given temperature and increase a delivery pressure of the low-pressure process source 535 to the static pump 500.

In a specific embodiment, as hereinafter described in greater detail, a gas flow metering device 545 comprises a mass flow controller in the delivery line 525 interconnecting the low-pressure process source 535 and the static pump 500. The gas flow metering device 545 can be of any suitable type, including for example a mass flow controller, a micro-valve element actuatable for dispensing very low flow rates of the process source component from the process source supply, a flowmeter coupled with a flow control valve in the dispensing line, or any other element or assembly that is effective to provide a selected flow rate of the low-pressure process source 535. The low-pressure process source 535 may optionally be heated by a source heater 540, such as an ampoule heater or a cylinder heating jacket. In addition, the delivery line 525 may be heated by a heating device such as a heat blanket 530 to create a heated pathway to prevent the low-pressure process source 535 from condensing prior to delivery to the static pump 500.

The static pump 500 arranged to mix the low-pressure process source 535 and the high-pressure diluent gas 512 for forming a mixed source 550 can be of any suitable type, whereby the low-pressure process source 535 and the high-pressure diluent gas 512 are intermixed with one another for discharge at an expected concentration of the low-pressure process source 535, e.g., for flow to the downstream dilute gas mixture-consuming process. The static pump 500 can, for example, comprise a venturi vacuum pump, multi-stage ejector, eductor, opposed jet-equipped mixing chamber, or other device, structure or assembly that effects mixing of the low-pressure process source 535 and the high-pressure diluent gas 512 to produce the mixed source 550 without nucleation and/or condensation of the low-pressure process source 535. In one embodiment, the pressure of the mixed source 550, also corresponding to the outlet pressure of the static pump 500 and the pressure across the nozzle 110, is substantially between one and five bars in pressure. In another embodiment, the pressure of the mixed source is substantially between 5 and 10 bars in pressure. In another embodiment, the pressure of the mixed source is between 10 and 20 bars in pressure.

In accordance with the invention, the delivery pressure of the mixed source 550 is less than the delivery pressure of the high-pressure diluent gas 512 due to expansion of the high-pressure diluent gas 512 through the static pump 500. In addition, by "low-pressure" and "high-pressure" is meant that the low-pressure process source 535 has a lower pressure than the high-pressure diluent gas 512. By way of example only, and not limitation, the delivery pressure of the high-pressure diluent gas 512 to the static mixer 500 may be at least about 5 bars, and may be as high as about 30 bars. By way of further example, and not limitation, the delivery pressure of the low-pressure process source 535 to the static mixer 500 may be at least about 5 torr (0.01 bar), and may be as high as about 25 bar, provided that the pressure of the low-pressure process source 535 is less than the pressure of the high-pressure diluent gas 512. In one embodiment, the pressure of the low-pressure process source 535 is greater than about 5 torr and less than about 5 bar, and the pressure of the high-pressure diluent gas 512 is greater than about 5 bar and less than about 30 bar. The actual pressures of the low-pressure process source 535 and the high-pressure diluent gas 512 will be dependent on the low pressure process source delivery temperature, the high-pressure diluent gas delivery temperature, the architecture of the static pump 500, and the desired mixed source pressure. It is within the skill of one of ordinary skill in the art to configure the gas manifold to arrive at the desired mixed source pressure.

The static pump 500 for generating a vacuum using overpressure is known in the art. Ejectors of the intended type, so called multi-stage ejectors, usually comprise two or more nozzles arranged in series within a house, wherein a surrounding space such as a chamber is associated to each respective nozzle, which extends through the partition wall between adjacent chambers. The nozzles present a through-channel with gradually increasing, sectional opening area, through which a stream of air with high velocity is fed to carry, through a slot located between the nozzles, air or other medium in the surrounding chamber and generate therein a lowering of the pressure.

When three or more nozzles are coupled in a series, the respective chamber is commonly in flow communication with a common or outer space, which has coupling means for connecting the vacuum pump to external equipment. A non-return valve in the form of e.g. a flexible tongue is arranged in the flow path to prevent leakage between the outer space and that chamber which, upon a certain difference in pressure, ceases to be active for further lowering of the pressure. Ejectors of this known construction may be formed with nozzles coupled in series, with different efficiency characteristics in order to provide both a high vacuum flow and a low vacuum level in one ejector.

The low-pressure process source 535 in the dilute gas supply system of one embodiment of the invention can be of any suitable type, depending on the specific diluted process source mixture-using process for which the diluted process source mixture is to be provided. The gas can be a gas that is a source material for etching or treatment of a surface, or alternatively for forming a thin film or unfusing a dopant in a surface. The diluted process source mixture-using process can be correspondingly varied, and can variously include industrial processes (e.g., chemical vapor deposition), medical diagnostics, research investigations, agricultural assays, treatment of the body with dilute radiological therapeutic agents, etc.

Figure 6:
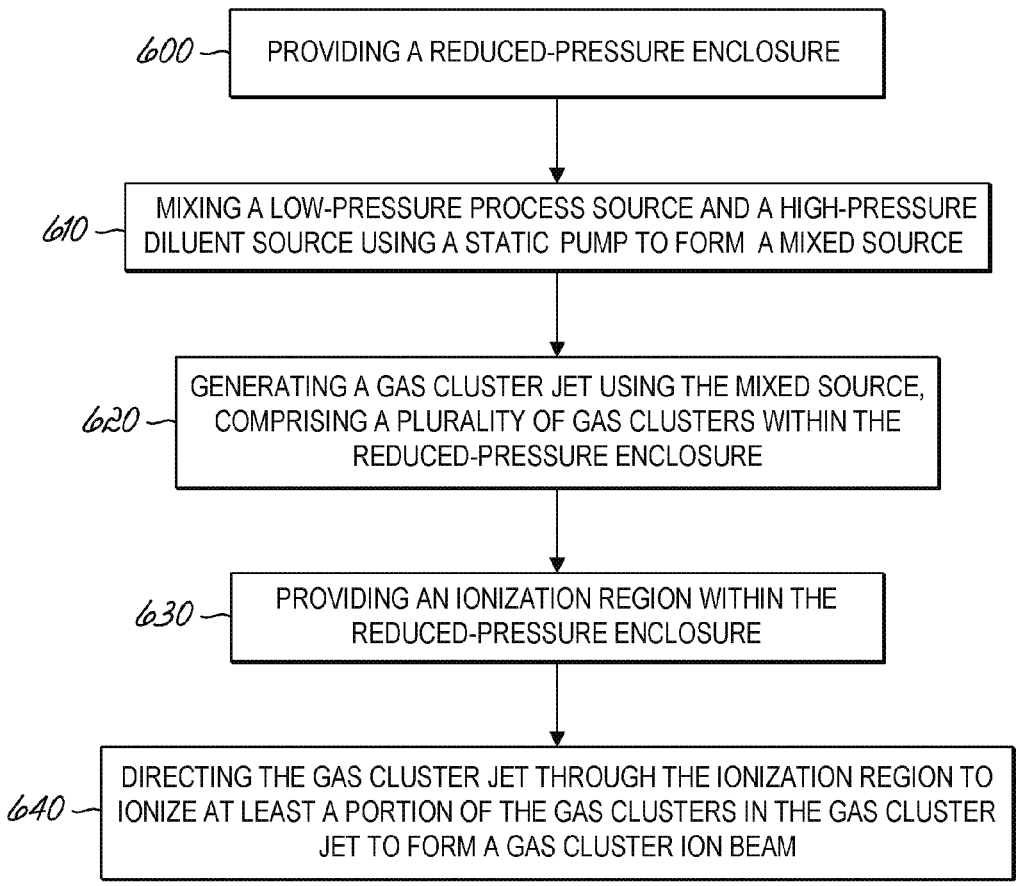
FIG. 6 is a flowchart describing one embodiment of a method to form a gas cluster ion beam using a low-pressure process source.

Referring to FIG. 6, a flowchart is provided to describe one embodiment of a method of forming a gas cluster ion beam using a low-pressure process source 535. At 600, the method comprises providing a reduced-pressure enclosure. At 610, the method comprises mixing low-pressure process source 535 with high-pressure diluent source 512 using a static pump 500 to form a mixed source 550. At 620, the method includes generating a gas cluster jet 118 within the reduced-pressure enclosure using the mixed source 550, wherein the gas cluster jet 118 comprises a plurality of gas clusters. For example, the mixed source 550 may be directed through a nozzle 110 within the reduced-pressure enclosure. At 630, the method includes providing an ionization region within the reduced-pressure enclosure. For example, the ionization region may be partially defined by inlet end 122a and outlet end 122b of ionizer 122, with inlet end 122a fluidically coupled to static pump 500 via nozzle 110 for receiving the gas cluster jet 118 generated from mixed source 550. An electron source, such as filament 124 or filaments 302a, 302b, and 302c, may be included for providing electrons to the ionization region. At 640, the method comprises directing the gas cluster jet 118 through the ionization region to ionize at least a portion of the gas clusters to form a gas cluster ion beam 128.

A plurality of embodiments of forming a gas cluster ion beam using a plurality of gas sources, including a low-pressure process source, has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a gas cluster ion beam with a plurality of gas sources, comprising:
    providing a reduced-pressure enclosure;
    mixing a low-pressure process source and a high-pressure diluent source using a static pump to form a mixed source, wherein a delivery pressure of the low-pressure process source to the static pump is greater than about 5 torr and less than about 5 bar, and a delivery pressure of the high-pressure diluent gas to the static pump is greater than about 5 bar and less than about 30 bar;
    generating a gas cluster jet using the mixed source, comprising a plurality of gas clusters within the reduced-pressure enclosure;
    providing an ionization region within the reduced-pressure enclosure; and
    directing the gas cluster jet through the ionization region to ionize at least a portion of the gas clusters in the gas cluster jet to form a gas cluster ion beam.

2. The method of claim 1, further including metering the low-pressure process source.

3. The method of claim 1, further including cooling the high-pressure diluent source prior to mixing the low-pressure process source and the high-pressure diluent source.

4. The method of claim 1, wherein the low-pressure process source is an organometallic compound containing a transition metal selected from the group consisting of scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tungsten, rhenium, osmium, iridium, platinum, and gold, and combinations thereof.

5. The method of claim 4, wherein the low-pressure process source is delivered to the static pump using a heated pathway.

6. The method claim 1, wherein the static pump is selected from the group consisting of a venturi vacuum pump, multi-stage ejector, eductor, and an opposed jet-equipped mixing chamber.

7. The method of claim 1, wherein a pressure of the mixed source is substantially between 1 and 5 bars.

8. A gas cluster ion beam system, comprising:
    a low-pressure process source;
    a high-pressure diluent source;
    a static pump fluidically coupled to the low-pressure process source and the high-pressure diluent source for mixing thereof, wherein a pressure of the low-pressure process source is greater than about 5 torr and less than about 5 bar, and a pressure of the high-pressure diluent gas is greater than about 5 bar and less than about 30 bar;
    an ionizer with an inlet end fluidically coupled to the static pump and an outlet end, the inlet end and the outlet end partially defining an ionization region through which a gas cluster jet comprising gas clusters is directed along an axis, from the inlet end to the outlet end; and
    an electron source for providing electrons to the ionization region, the electrons for ionizing at least a portion of the gas clusters to form a gas cluster ion beam.

9. The gas cluster ion beam system of claim 8, further including a gas flow metering device selected from the group consisting of a mass flow controller, an actuatable microvalve element, and a flowmeter coupled with a flow control valve.

10. The gas cluster ion beam system of claim 8, further including a cooling system to cool the high-pressure diluent source prior to mixing the low-pressure process source and the high-pressure diluent source with the static pump.

11. The gas cluster ion beam system of claim 8, further including a heated ampoule to deliver the low-pressure process source.

12. The gas cluster ion beam system of claim 8, further including an internally regulated canister to deliver the low-pressure process source.

13. The gas cluster ion beam system of claim 8, wherein the static pump is selected from the group consisting of a venturi vacuum pump, multi-stage ejector, eductor, and an opposed jet-equipped mixing chamber.

14. The gas cluster ion beam system of claim 8, wherein an outlet pressure of the static pump is substantially between 1 and 5 bars.

15. A multi-source gas cluster ion beam system, comprising:
- a low-pressure process source;
- a high-pressure diluent source;
- a static pump fluidically coupled to the low-pressure process source and the high-pressure diluent source for mixing thereof to form a source mixture, wherein a pressure of the low-pressure process source is greater than about 5 torr and less than about 5 bar, and a pressure of the high-pressure diluent gas is greater than about 5 bar and less than about 30 bar;
- a reduced-pressure enclosure; and
- a nozzle within the reduced-pressure enclosure and fluidically coupled to the static pump for forming from the source mixture a gas cluster jet comprising a plurality of gas clusters.

16. The multi-source gas cluster ion beam system of claim 15, further including a gas flow metering device selected from the group consisting of a mass flow controller, an actuatable micro-valve element, and a flowmeter coupled with a flow control valve.

17. The multi-source gas cluster ion beam system of claim 15, further including a cooling system to cool the high-pressure diluent source prior to mixing the low-pressure process source and the high-pressure diluent source with the static pump.

18. The multi-source gas cluster ion beam system of claim 15, further including a heated ampoule to deliver the low-pressure process source.

19. The multi-source gas cluster ion beam system of claim 15, further including an internally regulated canister to deliver the low-pressure process source.

20. The multi-source gas cluster ion beam system of claim 15, wherein a pressure drop across the nozzle is substantially between 1 and 5 bars.

21. A gas cluster ion beam system, comprising:
- a low-pressure process source;
- a heated ampoule to deliver the low-pressure process source;
- a high-pressure diluent source;
- a static pump fluidically coupled to the low-pressure process source and the high-pressure diluent source for mixing thereof;
- an ionizer with an inlet end fluidically coupled to the static pump and an outlet end, the inlet end and the outlet end partially defining an ionization region through which a gas cluster jet comprising gas clusters is directed along an axis, from the inlet end to the outlet end; and
- an electron source for providing electrons to the ionization region, the electrons for ionizing at least a portion of the gas clusters to form a gas cluster ion beam.

22. A multi-source gas cluster ion beam system, comprising:
- a low-pressure process source;
- a heated ampoule to deliver the low-pressure process source;
- a high-pressure diluent source;
- a static pump fluidically coupled to the low-pressure process source and the high-pressure diluent source for mixing thereof to form a source mixture;
- a reduced-pressure enclosure; and
- a nozzle within the reduced-pressure enclosure and fluidically coupled to the static pump for forming from the source mixture a gas cluster jet comprising a plurality of gas clusters.

* * * * *